United States Patent [19]
Whitehead

[11] Patent Number: 5,914,663
[45] Date of Patent: Jun. 22, 1999

[54] DETECTION OF SUBSIDENCE CURRENT IN THE DETERMINATION OF CIRCUIT BREAKER STATUS IN A POWER SYSTEM

[75] Inventor: David E. Whitehead, Pullman, Wash.

[73] Assignee: Schweitzer Engineering Laboratories, Inc., Pullman, Wash.

[21] Appl. No.: 08/951,378

[22] Filed: Oct. 16, 1997

[51] Int. Cl.⁶ .................................................. G08B 21/00
[52] U.S. Cl. .................... 340/638; 340/635; 340/644; 361/93; 324/424; 335/17
[58] Field of Search ..................... 340/657, 644, 340/635, 638; 361/93, 101, 55, 58; 324/424; 335/17

[56] References Cited

U.S. PATENT DOCUMENTS

| | | | |
|---|---|---|---|
| 4,685,024 | 8/1987 | Martellock et al. | 361/93 |
| 4,788,619 | 11/1988 | Ott et al. | 361/91 |
| 5,233,330 | 8/1993 | Hase | 340/638 |
| 5,510,773 | 4/1996 | Rodgers | 340/638 |

OTHER PUBLICATIONS

Transient Response of Current Transformers, IEEE, New York, N.Y. Jan. 1976.

How Can Current Dropout Affect Breaker Failure Timing Margins?, 49th Annual Conf., Protective Relay Engineers, Texas A&M Univ., Apr. 1996.

Operating Manual, Basler Electric, No. 9–1906–00–990.

*Primary Examiner*—Daniel J. Wu
*Assistant Examiner*—Anh La
*Attorney, Agent, or Firm*—Jensen & Puntigam, P.S.

[57] ABSTRACT

The apparatus detects subsidence current from unfiltered as well as filtered secondary current values in the current transformer. A lack of zero crossings during a predetermined period is a reliable indication of the presence of subsidence current. If subsidence current is detected, then a signal is generated which indicates that the circuit breaker for the power system has opened, providing an accelerated indication thereof relative to an indication produced by an overcurrent element dropping out.

36 Claims, 11 Drawing Sheets

ENHANCED SUBSIDENCE
DETECTION ALGORYTHM

FIG.12

DETECTION OF SUBSIDENCE CURRENT IN THE DETERMINATION OF CIRCUIT BREAKER STATUS IN A POWER SYSTEM

TECHNICAL FIELD

This invention relates generally to an apparatus which uses the secondary current of a current transformer in a power system to rapidly and accurately indicate that a circuit breaker in the electric power system has interrupted power system current in response to a fault, and more particularly, concerns such an apparatus which provides such an indication even when the secondary current of a current transformer includes decaying, or subsidence, current, after the power system current has been interrupted.

BACKGROUND OF THE INVENTION

Figure 1:
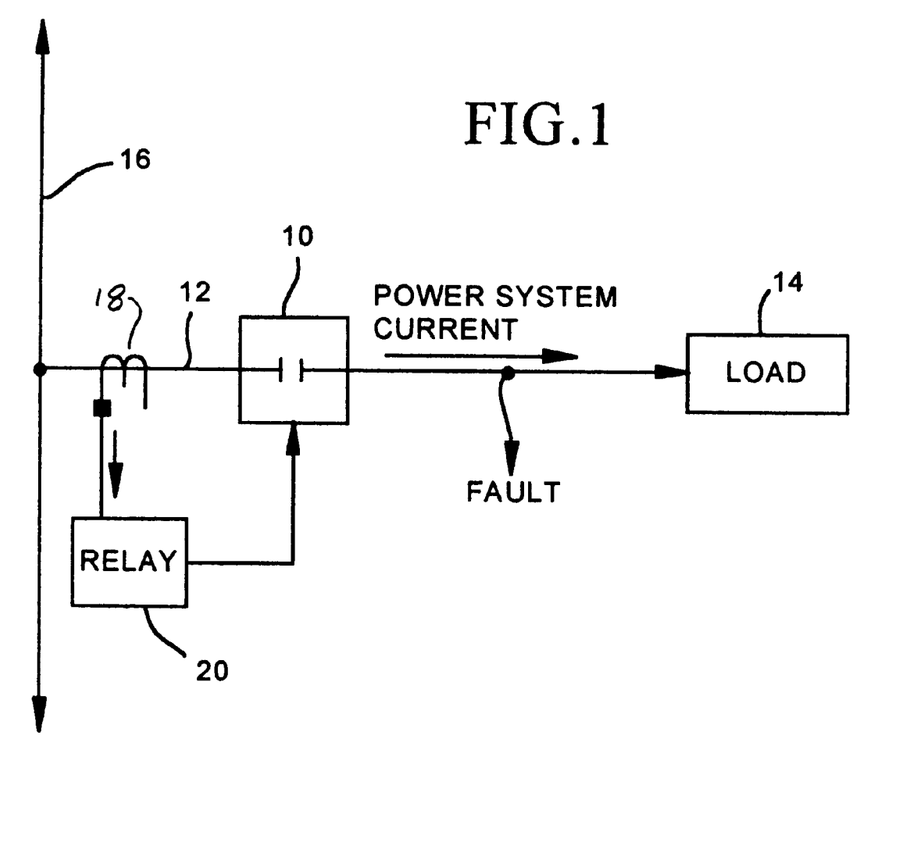
FIG. 1 is a block diagram showing a simple power system.

FIG. 1 shows a circuit breaker 10 which feeds power on a line 12 to a machine, apparatus or other load 14, from a bus 16. A current transformer 18 scales down the power system current, referred to as primary current, so that a protective relay 20 can safely measure the current. This scaled down current is referred to as secondary current herein. If the magnitude of the secondary current from current transformer 18 is above the setting of the protective relay 20, as it will be if there is a fault on the line, then the protective relay will "pick up" and trip the circuit breaker 10. The circuit breaker 10 interrupts the primary current. As a result, the secondary current in the transformer stops flowing, and the protective relay eventually drops out.

The safe operation of the power system serviced by the protective relay frequently depends on a rapid and accurate determination that interruption of primary current has occurred. For example, if the circuit breaker 10 fails to interrupt the primary current (as might happen if the breaker mechanism sticks, or a successful arc interruption does not take place) then other circuit breakers closer to the sources of electric power feeding the bus 16 must quickly operate. Further, even when there is a normal interruption, rapid and accurate confirmation that the breaker has in fact opened is often required.

Secondary current (or lack thereof) is often used to rapidly determine that the primary current is zero, which in turn is an accurate indication that the breaker has in fact opened. Such a determination of breaker status using secondary current is affected by both the design of the relay and also by the performance of the current transformer.

Figure 2:
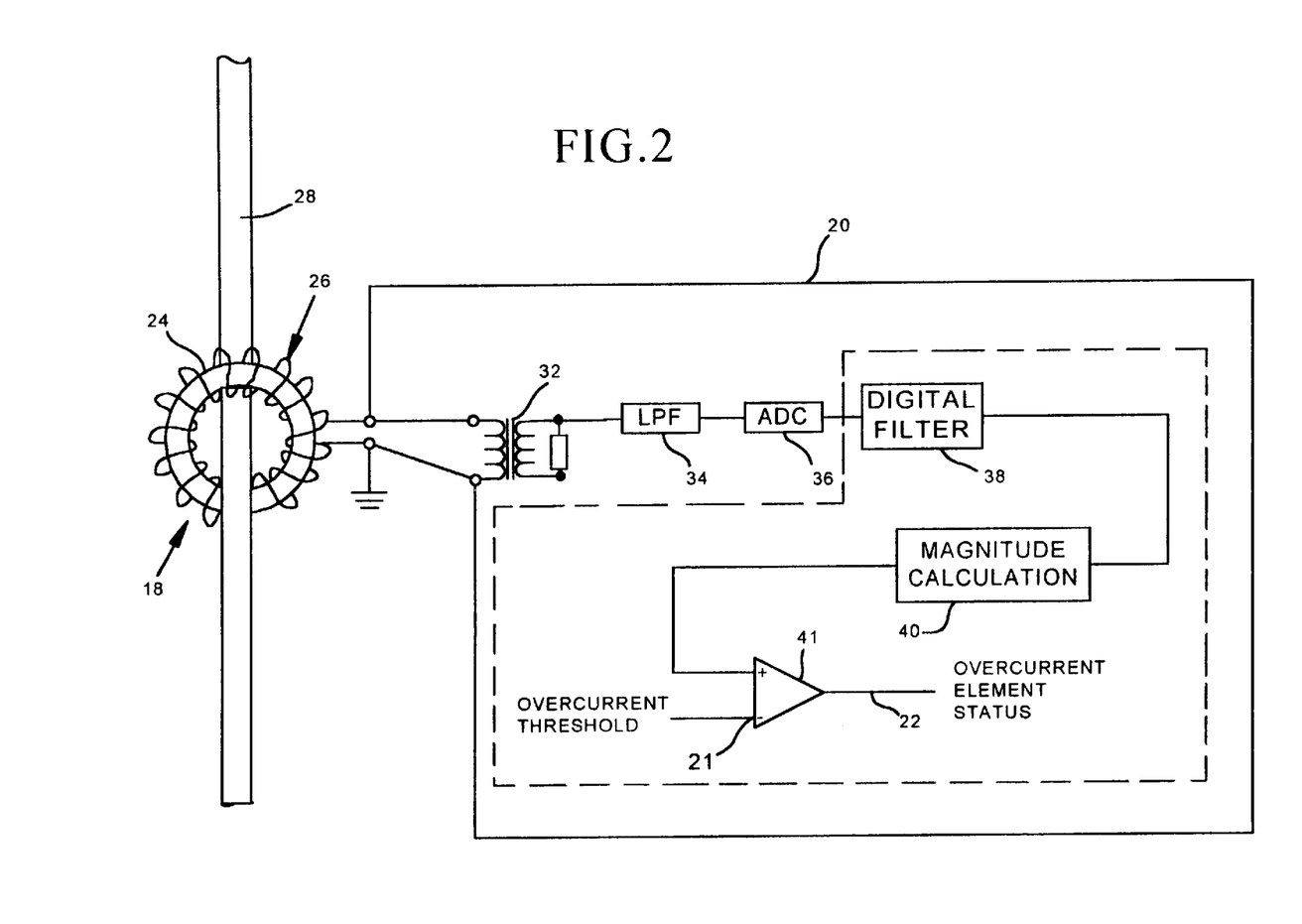
FIG. 2 is a circuit diagram showing a more detailed version of FIG. 1.

Referring to FIG. 2, almost all current transformers consist of an iron core 24 with a secondary winding 26. The primary of current transformer 18 is typically a conductor 28 which makes one pass through core 24. Power system current flowing in the primary winding of the current transformer 18 produces secondary current at the secondary winding 26. The secondary current is applied to a protective relay 20. The secondary current is further scaled down by a protective relay current transformer 32. The output of current transformer 32 is connected to an analog low pass filter (LPF) 34, the output of which is applied to an analog-to-digital converter (ADC) 36. The digital samples from ADC 36, referred to hereinafter as raw current (RAW I), are applied to a digital filter 38. The output of digital filter 38 is referred to hereinafter as filtered current (FILTER I). The functions enclosed by the dotted line are performed by a microprocessor.

The magnitude of the filtered current is then determined by magnitude calculator 40 and the result is applied to a comparator 41, which compares the magnitude against an overcurrent threshold at input 21. If the magnitude is greater than the overcurrent threshold then an overcurrent element 22 is picked up. If the magnitude is less than the overcurrent threshold at 21 then overcurrent element 22 is not picked up or drops out after having been previously picked up.

Figure 3:
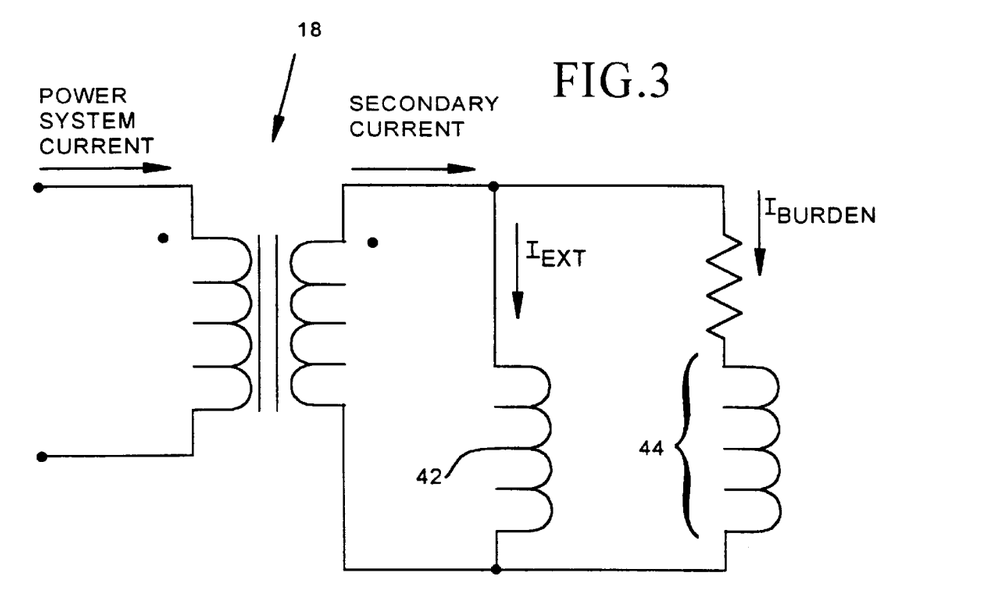
FIG. 3 is a simple circuit diagram showing secondary current flow prior to primary current in a current transformer being interrupted.

FIG. 3 shows a model of current transformer 18 and the connected burden (which includes the input impedance of protective relay 20) with the circuit breaker closed. FIG. 3 also shows the direction of the secondary current flow, which comprises current through the transformer excitation branch 42 and the burden impedance 44 when the power system current is flowing. Those two currents are in-phase with the power system current.

Figure 4:
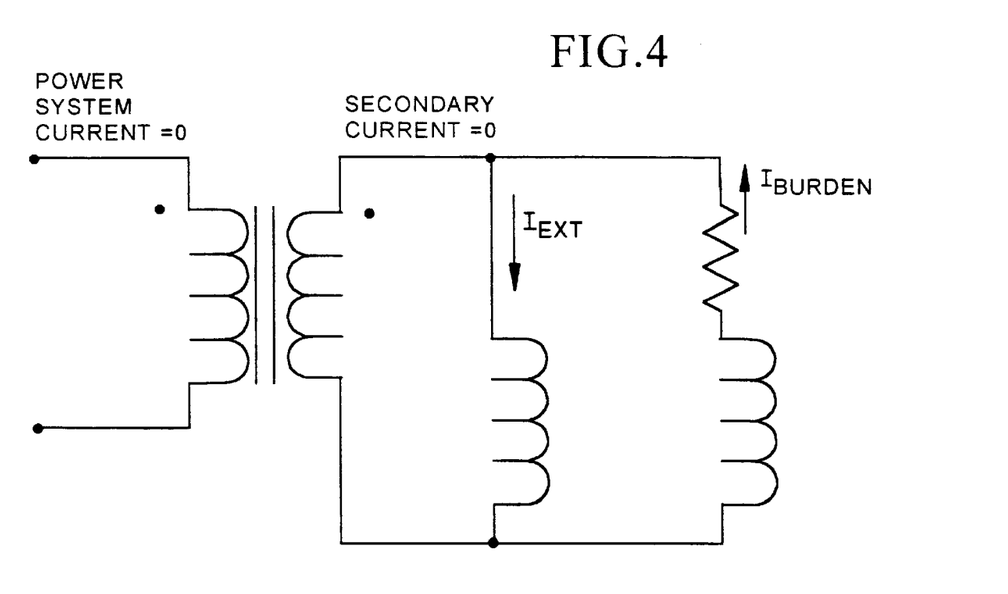
FIG. 4 is a simple circuit diagram showing secondary current flow following interruption of the primary current.

FIG. 4 shows the secondary current flow when the power system current source is not present, i.e. circuit breaker 10 has opened up. At that point there is no longer an AC component to the secondary current, only a decaying exponential current. The current throughout the burden impedance flows opposite to the direction of current flow when the breaker was closed.

Figure 5:
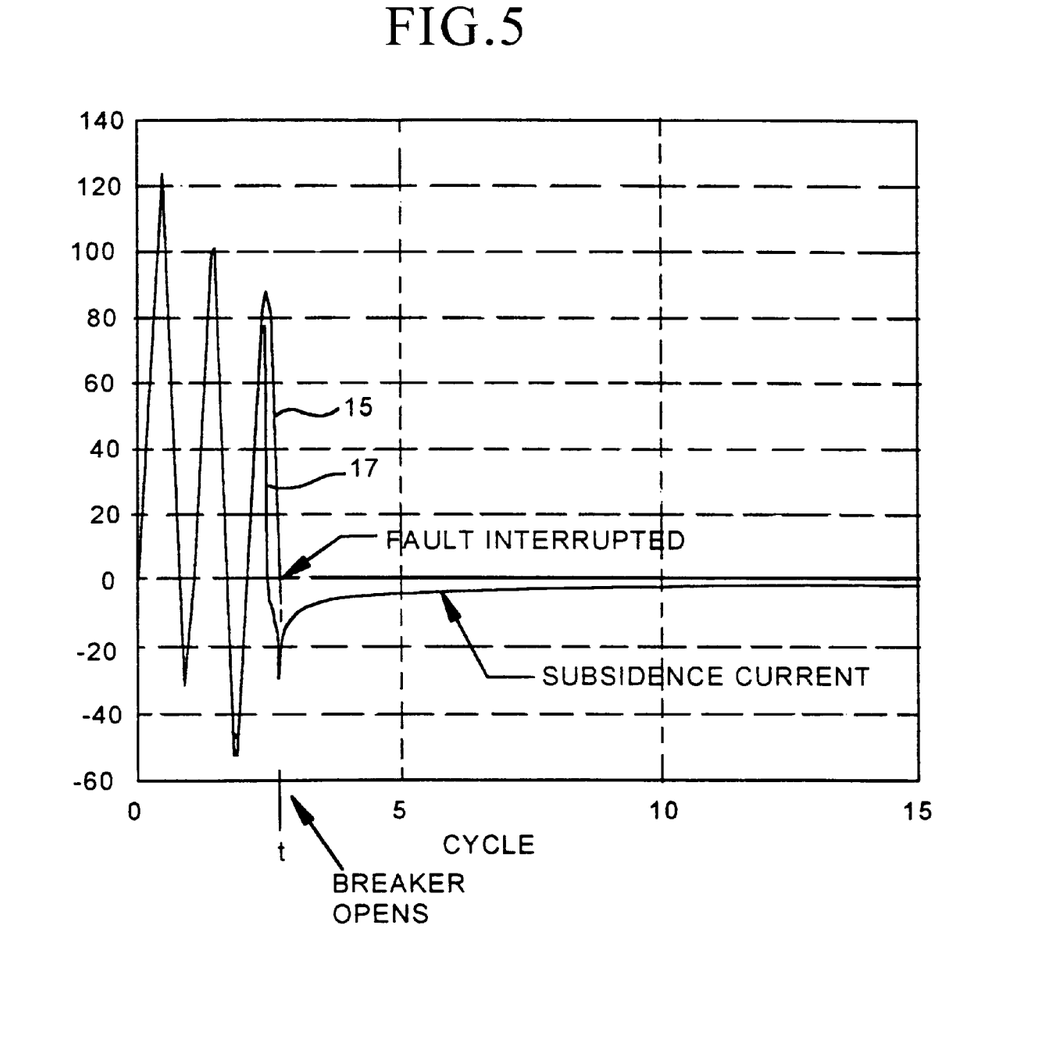
FIG. 5 is a diagram showing power system (primary) current and subsidence current prior to and following a fault.

FIG. 5 shows scaled power system primary current and secondary current of the current transformer 18 during and immediately following a fault. In FIG. 5, the power system primary current is successfully interrupted by the circuit breaker 10 at a time "t". Ideal secondary current is shown at 15, while actual secondary current is shown at 17. The secondary current, however, is not immediately interrupted in many current transformers. At time t, the magnetic flux in the current transformer core is very high. The flux decays from this high value over time. The decaying flux results in a decaying unipolar current flowing in the secondary of current transformer 18. The decaying current is characterized by no zero crossings and eventually subsides to zero over an extended period of time. This decaying current in the transformer secondary is referred to as subsidence current.

Subsidence current can cause the overcurrent element of the protective relay to remain picked up (indicating erroneously that primary current is still flowing), long after the circuit breaker has, in fact, actually successfully interrupted the primary current. This extended pick up of overcurrent elements is called delayed drop out. If an overcurrent element is used to indicate breaker status and has a very long drop out delay then the control circuits of the power system might improperly make a serious system error indicating that the primary current has not been interrupted and then initiating remedial and undesirable action, such as tripping additional breakers.

The subsidence current in the secondary of the current transformer creates the same problems regardless of the characteristics of the protective relay, i.e. whether the relay elements are electromechanical in nature or in a microprocessor implementation in which successive samples of secondary current are processed with computer algorithms. Subsidence current is neither DC nor a linear ramp signal but instead is a decaying exponential. Accordingly, the filtering methods for the protective relays cannot fully reject the decaying exponential subsidence current, which in turn keeps the overcurrent elements that are set to a low threshold asserted. Hence, the problem with subsidence current remains, even with the modern computer relays.

A primary purpose of this invention is to reduce the time it takes to determine that the primary current in the circuit breaker has been successfully interrupted. In the present invention, the presence of subsidence current is identified and appropriate action taken accordingly.

DISCLOSURE OF THE INVENTION

Accordingly, the invention is an apparatus for detection of subsidence current in a current transformer which is in a power system which includes a protective relay and an associated circuit breaker, wherein the dropping out of a current-responsive element in the protective relay indicates that the circuit breaker is open and wherein existence of subsidence current applied to the current-responsive element extends excessively the current-responsive element drop out time following opening of the circuit breaker, wherein the apparatus comprises means for detecting a zero crossing, during a predetermined period of time, for at least one of (a) unfiltered secondary current and (b) filtered secondary current wherein the predetermined time is greater than half the period of the frequency of the power system signal and the lack of zero crossings indicates the presence of subsidence current; and means for processing the output of the detector and the output status of the current-responsive element to generate a resulting signal which indicates that the breaker has in effect opened, in the event that no zero crossings are detected during said predetermined time.

BEST MODE FOR CARRYING OUT THE INVENTION

As discussed above, subsidence current occurs at the secondary of a current transformer after the primary current has been interrupted, i.e. when there is no current on the power line, such as due to a circuit breaker actually opening. When a fault occurs and the circuit breaker opens in response to a signal from a protective relay, the current stops flowing on the power line and the primary current to the current transformer is interrupted at the primary of the current transformer. However, current will continue to flow through the load connected to the secondary of the current transformer, even though there is no primary current. This continuing current, as discussed above, is referred to as subsidence current.

Subsidence current tends to delay the overcurrent element from dropping out, until the subsidence current goes below the protective element threshold, even though the circuit breaker may have already opened and there should be no current at all reaching the overcurrent element. Subsidence current makes it appear as though primary current is still flowing and the overcurrent element thus believes (erroneously) that the circuit breaker has yet to open.

In the present invention, the presence of subsidence current is first detected and then a signal is generated which is indicative of the overcurrent element dropping out, in advance of the element actually dropping out. This early indication of drop-out is then communicated to the control portion of the system. A faster (and more accurate) indication of breaker opening is thus produced. This result has significant benefits in a variety of applications. First, the more accurate indication of the circuit breaker opening provides better information on correct operation of the protective circuitry in accordance with its operating specifications. Second, in a breaker failure recognition application, the more accurate indication of breaker operation indicates that the breaker is operating properly (or not) and that there is no failure of the breaker itself. Other applications are, of course, possible.

Normal secondary current is periodic, with regular zero crossings. A fundamental characteristic of subsidence current, however, is that it is not periodic, i.e. there are no zero crossings. Subsidence current is detected in the present invention by monitoring the sign of the secondary current. If the sign of the secondary current changes within a specific time interval, the secondary current is periodic and thus is not subsidence current. When the sign of the secondary current does not change within the specific time interval, however, the presence of subsidence current can be declared. The specific time interval used for comparison in the embodiment shown is approximately the period of the power line signal frequency.

Figure 6:
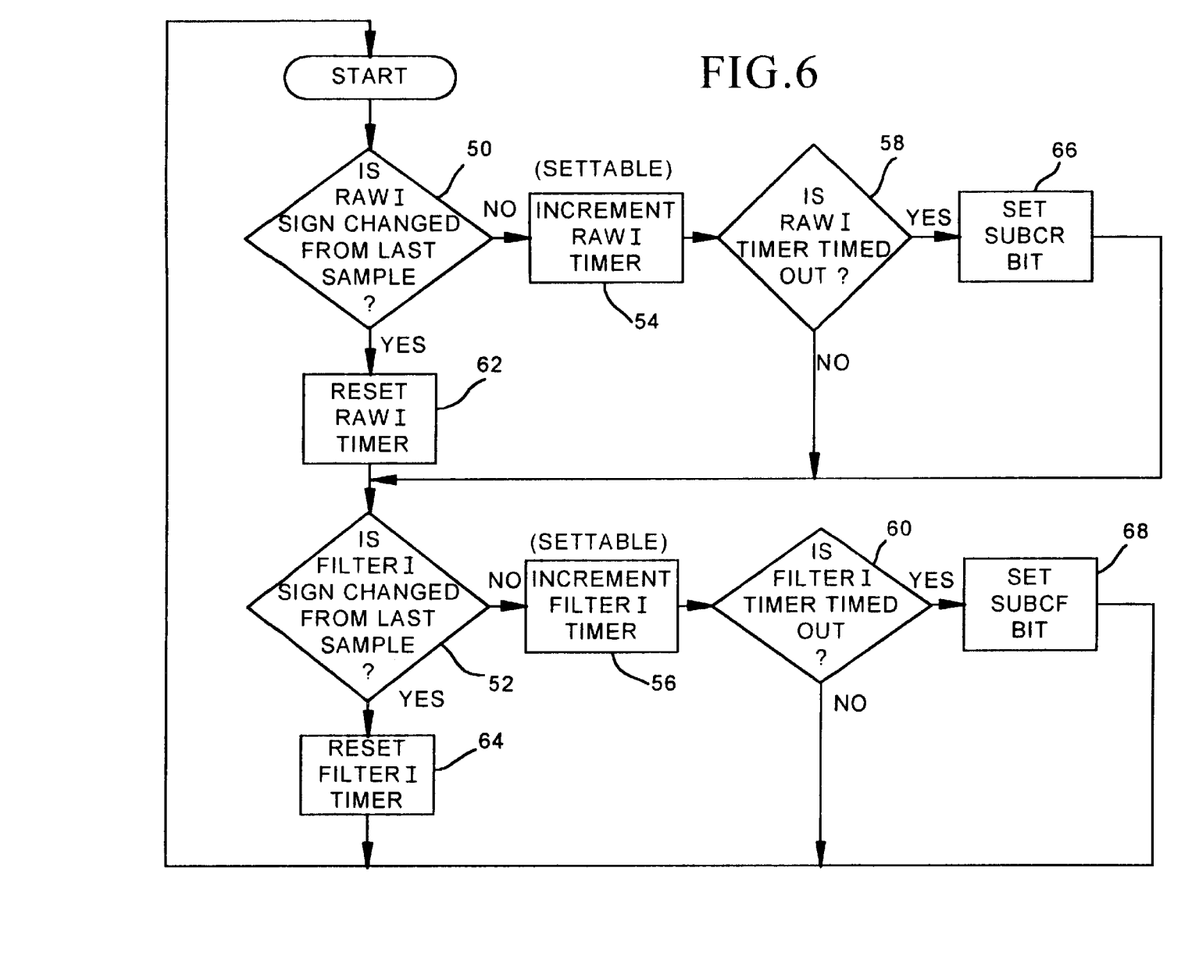
FIG. 6 is a flow diagram showing the determination of subsidence current.
Figure 7:
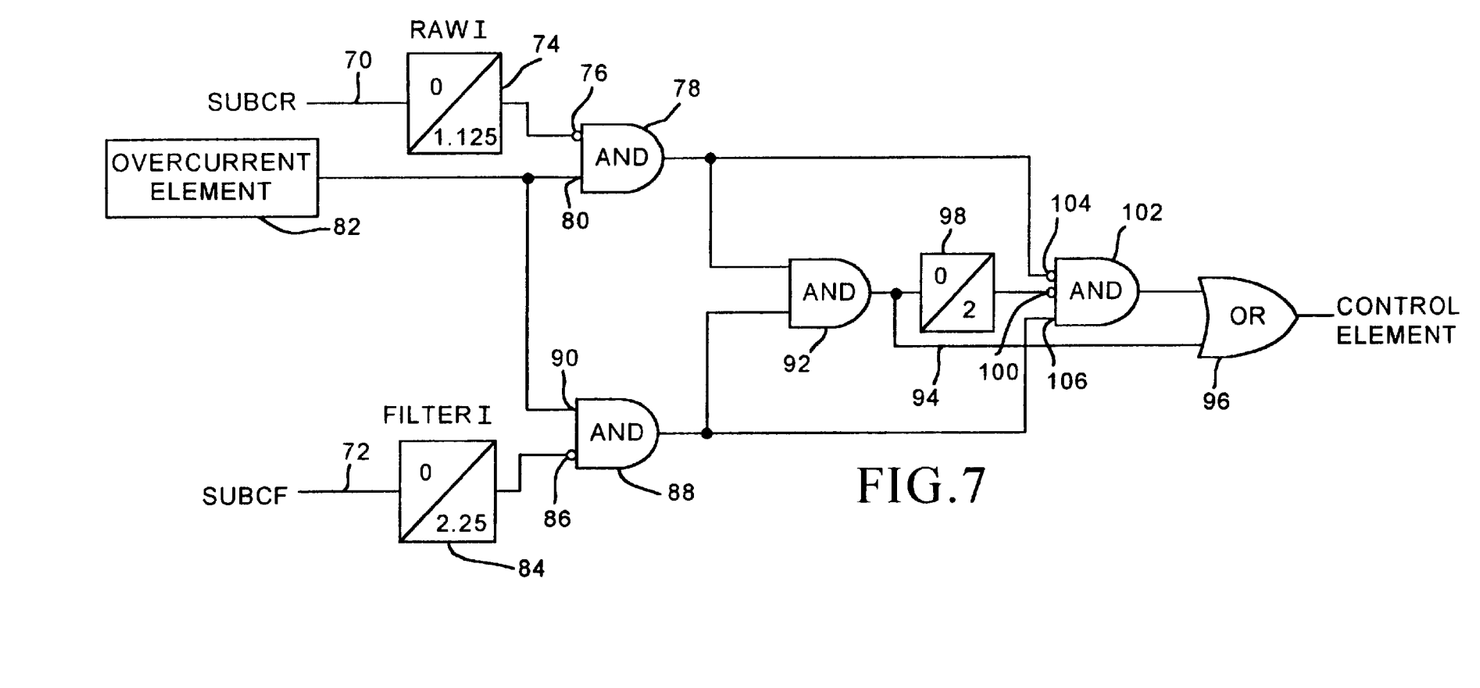
FIG. 7 is a circuit diagram using the determination of subsidence current to provide an accelerated indication of the circuit breaker opening.

The subsidence determination process is shown in FIG. 6. The process determines the presence of subsidence current by monitoring both the raw current (RAW I) and the filtered secondary current (FILTER I) for zero crossings. Both of these results are used in follow-on circuitry, such as shown in FIG. 7. RAW I and FILTER I values are obtained, as indicated above, from the output of the ADC 36 and the digital filter 38 in the protective relay, as discussed above.

Referring to FIG. 6, which is a flow chart of the subsidence current determination process, the raw current (RAW I) and filtered current (FILTER I) values are sampled 16 times per power system cycle and reviewed for a sign change relative to the previous sample, at blocks 50 and 52, respectively. With respect to the raw current, if there has not been a secondary current sign change for the last sample, a timer 54 is incremented. The timer 54 is settable, but in the embodiment shown is approximately equal to the period of the power system signal.

Similarly, if there is no sign change in the sample of the filtered current relative to the previous sample, a timer 56 is incremented. Timer 56 is also settable, which in the embodiment shown is approximately 1.125 power system cycles. The incremented timers 54 and 56 are then interrogated to determine whether they have timed out. This is shown at blocks 58 and 60. If the timers have not timed out, then circuits 50 and 52 wait for the next sample. If there has been a sign change in either the raw or filtered current values, the respective timers are reset, as shown at blocks 62 and 64. If the timers 58 and/or 60 time out, indicating no sign change in the current, then a signal is generated which sets a corresponding subsidence current detection bit high, as shown at blocks 66 and 68.

While it is not necessary to use two subsidence current detectors, one operating on raw current and the other on filtered current, the use of two detectors does have some advantages. For instance, the detection time of the raw data detector, referred to herein as a SUBCR (Subsidence Current-Raw) detector, is typically faster than that for the filtered data detector, referred to herein as a SUBCF (Subsidence Current-Filtered) detector. Thus, the SUBCR indication accelerates the drop-out of the overcurrent elements even more than the SUBCF detector. On the other hand, the SUBCF detector will not pick up during no-load conditions when the only signal measured by the relay is that of the analog-to-digital converter noise. Hence, the SUBCF detector prevents erroneous subsidence current declarations for A-D noise or offset current.

The outputs of the SUBCR and SUBCF detectors are applied to the circuit of FIG. 7. The SUBCR data is applied on input line 70, while the SUBCF data is applied on input line 72. SUBCR line 70 is applied as an input to an instantaneous pickup, delayed drop-out timer 74. In the embodiment shown, the delayed drop-out time is set at 1.125 cycles, although this time can be varied. When there is no subsidence current for 1.125 cycles of the power system signal, the output of timer 74 will match the low input thereto.

The signal output from timer 74 is inverted before it is applied to input 76 of AND gate 78. The other input 80 to AND gate 78 is the output of the overcurrent element 82 in the relay. As indicated above, the status of the overcurrent element 82 is used to provide an indication of when the circuit breaker associated with the relay has opened in response to a fault. The threshold of the overcurrent element is accordingly set exceedingly low, such that normal load current will exceed the threshold. In that case, the overcurrent element is in fact utilized as an undercurrent element in the relay. Thus, for the circuit of FIG. 7, when power system current is flowing and the circuit breaker is closed, the current magnitude will exceed the threshold in the overcurrent element and the signal from element 82 will be high. This is applied to input 80 of AND gate 78. Thus, under normal conditions (no fault), the output of AND gate 78 will be high.

The signal from the SUBCF detector is applied to a second timer 84. Timer 84 is an instantaneous pickup, delayed drop-out timer, similar to that of timer 74. In the embodiment shown, the drop-out time is set to 2.25 cycles, although again this time can be varied. The input to timer 84 will be low when no subsidence current has been detected, i.e. such as when power system current is in fact flowing. The output of timer 84 under such a condition will also be low, 2.25 cycles after SUBCF goes low. This low output will be inverted to a high at one input 86 to AND gate 88. Since the other input 90 to AND gate 88 from the overcurrent element is also high when power system current is flowing, the output of AND gate 88 will be high under steady-state power system conditions.

The outputs of AND gates 78 and 88 are connected as first and second inputs to AND gate 92. The output of AND gate 92 is thus also high when power system current is flowing. The output of AND gate 92 is applied on line 94 as one input to OR gate 96. Thus, when power system current is flowing, the output of OR gate 96 is high. This output signal is programmed to a contact element in the relay. The high condition of the signal sets the contact element such that the circuit breaker is indicated to be closed.

The output of AND gate 92 is also applied to a timer 98. Timer 98 is also an instantaneous pickup, delayed drop-out timer, with a drop-out delay of two cycles in the embodiment shown. The output of timer 98 will thus also be high when power system current is flowing. The output of timer 98 is inverted to a low at one "not" input 100 to AND gate 102. The output of AND gate 78, which is high when power system current is flowing, is inverted and applied at a second not input 104 to AND gate 102, while the output of AND gate 88, also high when power system current is flowing, is applied at a third input 106 to AND gate 102. The inputs to AND gate 102 under normal conditions are thus low, low and high (at inputs 104, 100 and 106) and hence the output of AND gate 102 is normally low. This low output is applied to OR gate 96. However, this low input to OR gate 96 will not affect the high output of OR gate 96 during normal operations, due to the high input from AND gate 92.

When a fault occurs, the circuit breaker on the line will open in response to action of the protective relay and power system current will stop flowing. Ideally, this would result in the overcurrent element quickly dropping out and the output thereof going to a low because the secondary current input would be zero, below the overcurrent threshold. However, subsidence current, as discussed above, is at a sufficiently high level, following opening of the breaker, to maintain the output of the overcurrent element high for a time. The signal output of the overcurrent element 82 thus remains high for a time following interruption of the power system current.

During this time, however, subsidence current will be recognized by the SUBCR and SUBCF detectors. Typically, the SUBCR detector will recognize the presence of subsidence current first, and when it does, the input signal on line 70 to timer 74 will go high. The output of timer 74 will immediately go high (pick up) as well. This signal will be inverted to a low at input 76 to AND gate 78, resulting in the output of AND gate 78 going low, the input to AND gate 92 from AND gate 78 going low, and the input to timer 98 going low. The input to OR gate 96 from AND gate 92 going low causes the output of OR gate 96 to immediately go low, indicating that current is not flowing in the power system and that the circuit breaker has opened. The output of timer 98, however, remains high for two cycles before it can go low, due to the delayed drop-out nature of the timer. Thus, the output of timer 98 will remain high and the inverted signal at input 100 will remain low for a period of two cycles following detection of subsidence current.

When the output of AND gate 78 goes low, inverting input 104 will go high. Following the drop-out time of timer 98 (two cycles) after subsidence current has been recognized by the SUBCR detector, the output of AND gate 102 will be high until subsidence current is recognized by the SUBCF detector.

Prior to the two cycles required by timer 98 to drop out, however, with the output of AND gate 78 and consequently the output of AND gate 92 being low and if the SUBCF detector has not yet gone high so that the output of AND gate 88 is high, the output of OR gate 96 will be low, since the output of timer 98 is still high.

As soon as subsidence current is detected by the SUBCF detector, however, the output from AND gate 88 will go low, including input 106 to AND gate 102. Thus, OR gate 96 will remain low. This low signal from OR gate 96 is applied to the contact element which is programmed to set the contact indicating that the breaker has in fact opened, even though the output from the overcurrent element is still high due to the subsidence current. Hence, the delaying effect of the subsidence current has been significantly reduced, and the recognition of the circuit breaker contacts opening has been accelerated.

In brief summary, the output of OR gate 96 will be high when the power system current is above the overcurrent threshold in the relay and subsidence current is not detected, using either raw or filtered data. When a circuit breaker opens and subsidence current is detected and the logic of FIG. 7 is satisfied, the output of OR gate 96 will go low, even if the overcurrent element is picked up. More specifically, SUBCR goes high (asserts), OR gate 96 goes low and timer 98 begins to operate but AND gate 102 remains low. Then SUBCF asserts before timer 98 expires, keeping AND gate 102 low and OR gate 96 low. A low from OR gate 96 indicates that power system current is not flowing and that the circuit breaker has opened.

Figure 8:
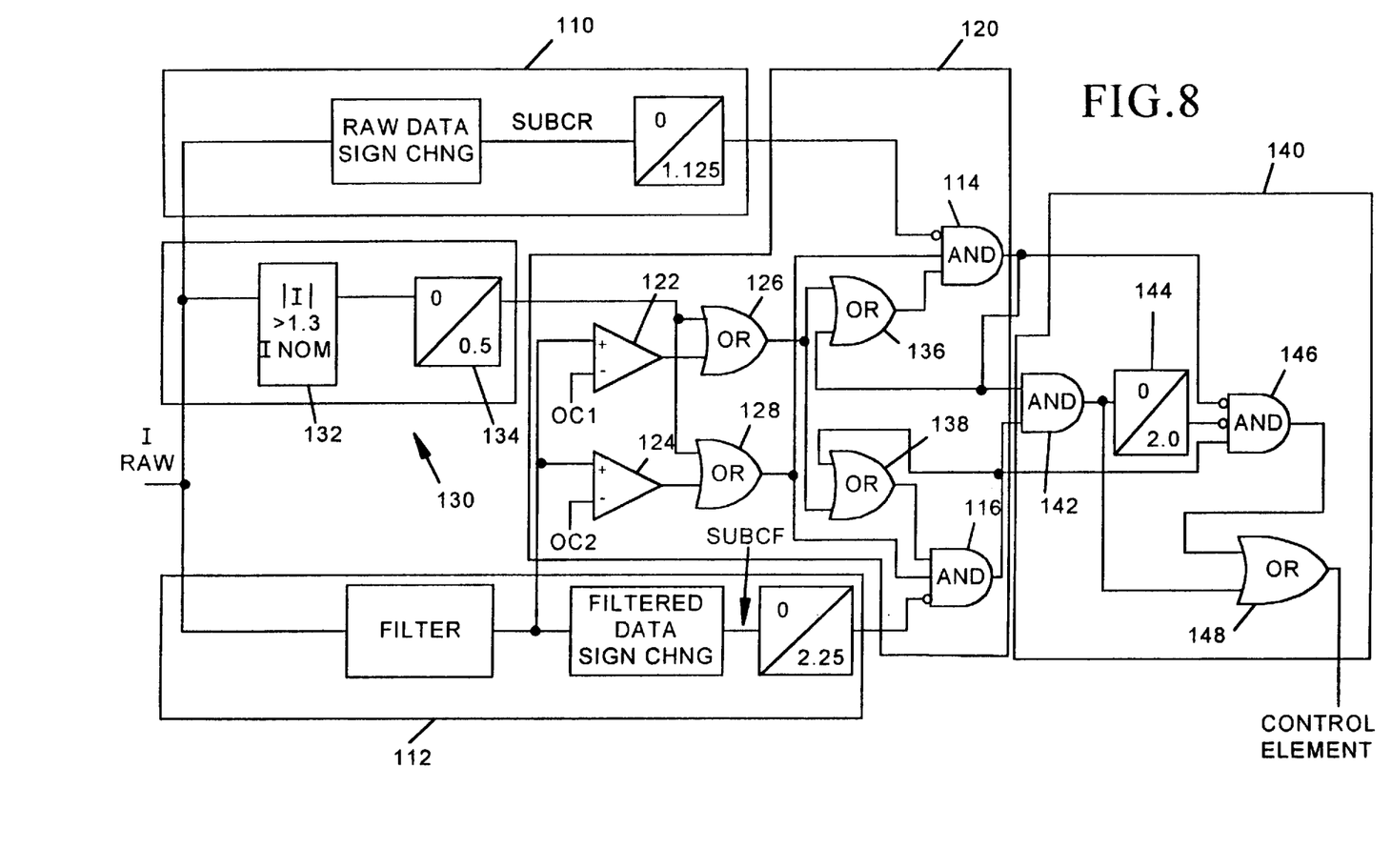
FIG. 8 is a circuit diagram which includes the functions of FIGS. 6 and 7 and further includes hysteresis compensation with the use of two overcurrent elements.

A variation of the combination of FIGS. 6 and 7 is shown in FIG. 8. Blocks 110 and 112 detect subsidence current, block 110 for raw current and block 112 for filtered current. The outputs of blocks 110 and 112 are applied as inputs, respectively, to AND gates 114 and 116 in circuit block 120. In block 120, two overcurrent elements OC1 and OC2 create a hysteresis effect. The hysteresis is used to prevent a "chattering" effect (rapid succession of pickup/drop-out when the current is near a single pickup threshold). The outputs of the overcurrent elements are applied to comparators 122 and 124 along with the filtered current value produced by block 112. The outputs of comparators 122 and 124, respectively, are applied to OR gates 126 and 128, along with the output of circuit block 130. Circuit block 130 detects analog-to-digital (A-D) converter saturation. For magnitudes of current (I) greater than 1.3 times the value of nominal current (Inom), as determined by comparator 132, an output of block 130 in effect forces the pickup of the two overcurrent elements OC1 and OC2.

The pickup of the overcurrent elements is maintained by the action of timer 134 for one-half cycle after the current magnitude I drops below 1.3 times the nominal current value. Block 130 ensures that large fault currents, which would look like DC waveforms and thus would be rejected by the digital filters, do not erroneously force the drop-out of the overcurrent elements. This erroneous drop-out of the overcurrent element would lead to a premature declaration that current is not flowing in the power line.

The output of OR gate 126 is applied as one input to OR gates 136 and 138, the outputs of which are applied, respectively, as inputs to AND gates 114 and 116, which compare to AND gates 78 and 88 in FIG. 7. The output of OR gate 128 is applied as another input to AND gates 114 and 116. The outputs, respectively, of AND gates 114 and 116 are applied back as inputs to OR gates 136 and 138. The OR gates 136 and 138 are used in the supervision of hysteresis created by the two overcurrent elements. The remaining circuit block 140 is similar to that shown in FIG. 7, with outputs of AND gates 114 and 116 being applied as inputs to an AND gate 142, with timer 144, AND gate 146 and OR gate 148 being arranged and operating similarly to similar elements in FIG. 7. The output of OR gate 148 is programmed to the output contact which indicates whether or not the breaker has opened.

FIGS. 9–12 show a further development of the present invention. The invention of FIGS. 1 through 8 detects the presence of subsidence current by determining the lack of zero crossings of the transformer secondary current within a set period of time. A lack of zero crossings indicates that power system current is not flowing (only subsidence current remains) so that in fact the breaker has opened and the overcurrent element can be reset. In that embodiment, it is only the secondary current measurements which are used to determine the circuit breaker status. Due to the particular algorithm used, however, time delays and other factors may delay unnecessarily the declaration that subsidence current is present.

In some protective circuits, such as for instance breaker failure relays, certain additional information about the operation of the power system is available which can be used along with the secondary current information to more quickly determine the status of the circuit breaker. This information will include the secondary analog line current data as well as the status of the trip command produced by a protective relay. In the embodiment of FIGS. 9–12, such additional information is used to increase the speed of the determination of subsidence current, while at the same time maintaining good security.

As discussed above, a typical steady-state power system current waveform is sinusoidal, which includes a sign change at the zero crossings, every half-cycle. The first derivative of that current waveform also has a sign change, also at every half-cycle, but at the peaks (positive and negative) of the waveform. The time between the zero crossing sign change and the sign change of the first derivative is a quarter-cycle. If the current wave form is, however, fully offset from zero (instead of symmetrical about zero), where the waveform initially has a zero crossing only in the vicinity of a peak of the waveform, the time between successive zero crossing sign changes is a full cycle. Fully offset waveforms can occur during a fault. The same is true for the first derivative sign changes. Hence, for a fully offset waveform, the difference between a zero crossing sign change and a first derivative sign change is a half-cycle.

Figure 9:
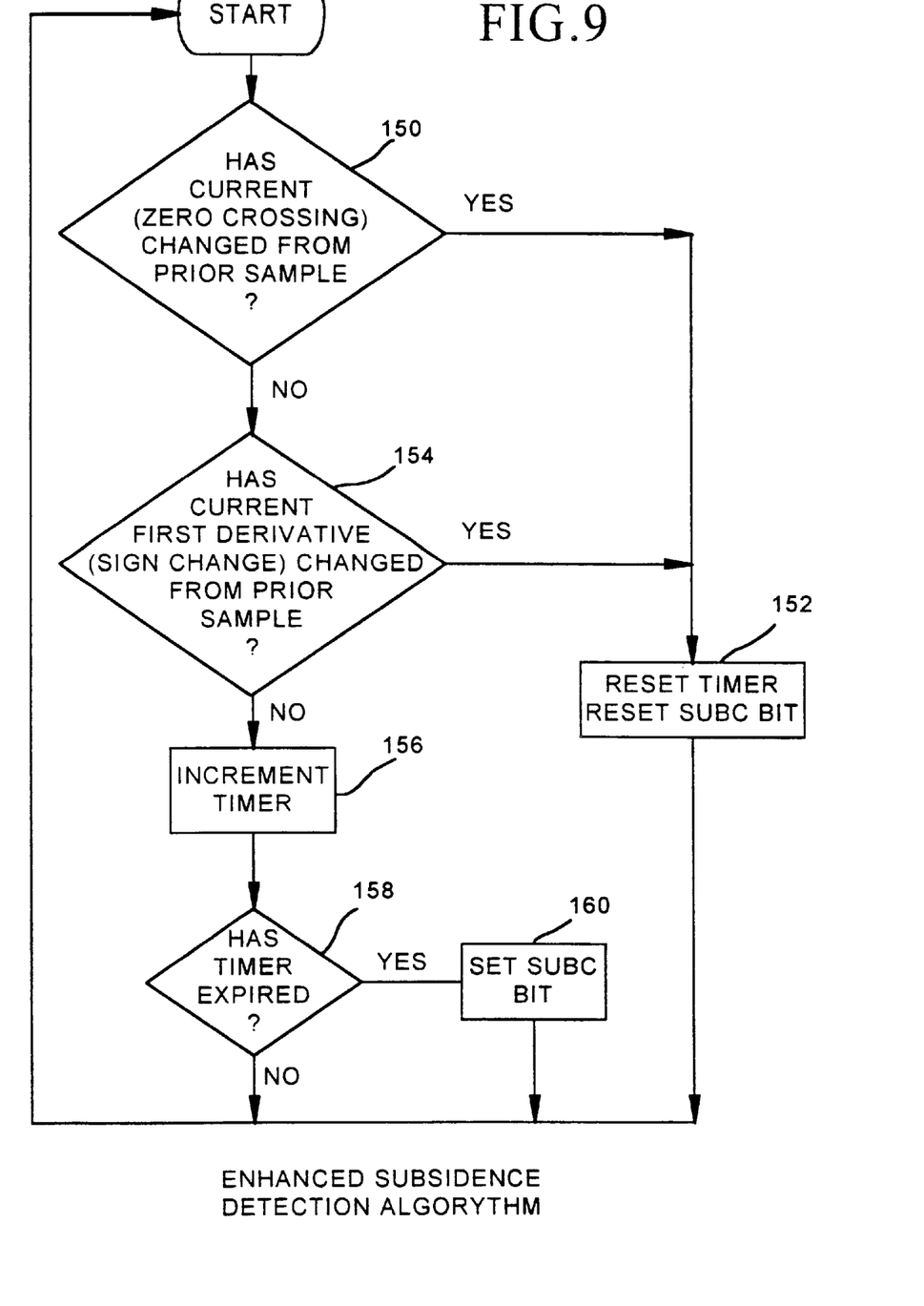
FIG. 9 is a block diagram of a portion of another embodiment of the present invention.
Figure 10:
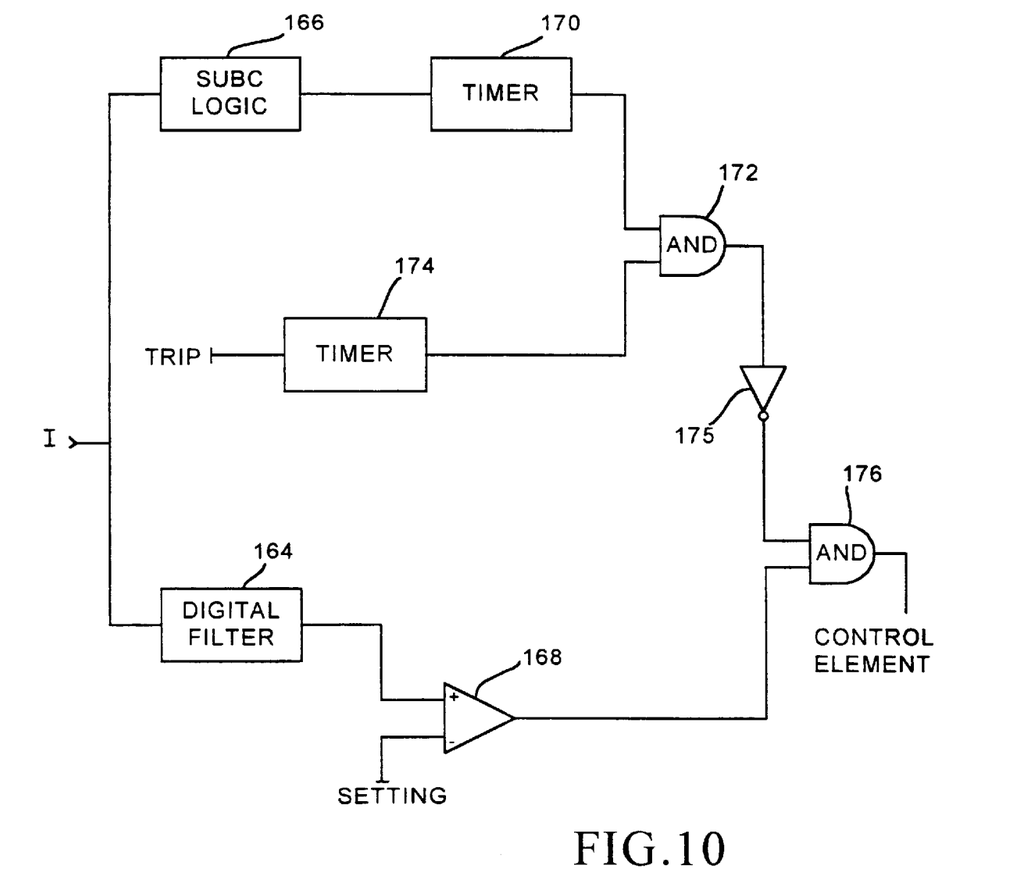
FIG. 10 is a block diagram of the embodiment referred to relative to FIG. 9.
Figure 11:
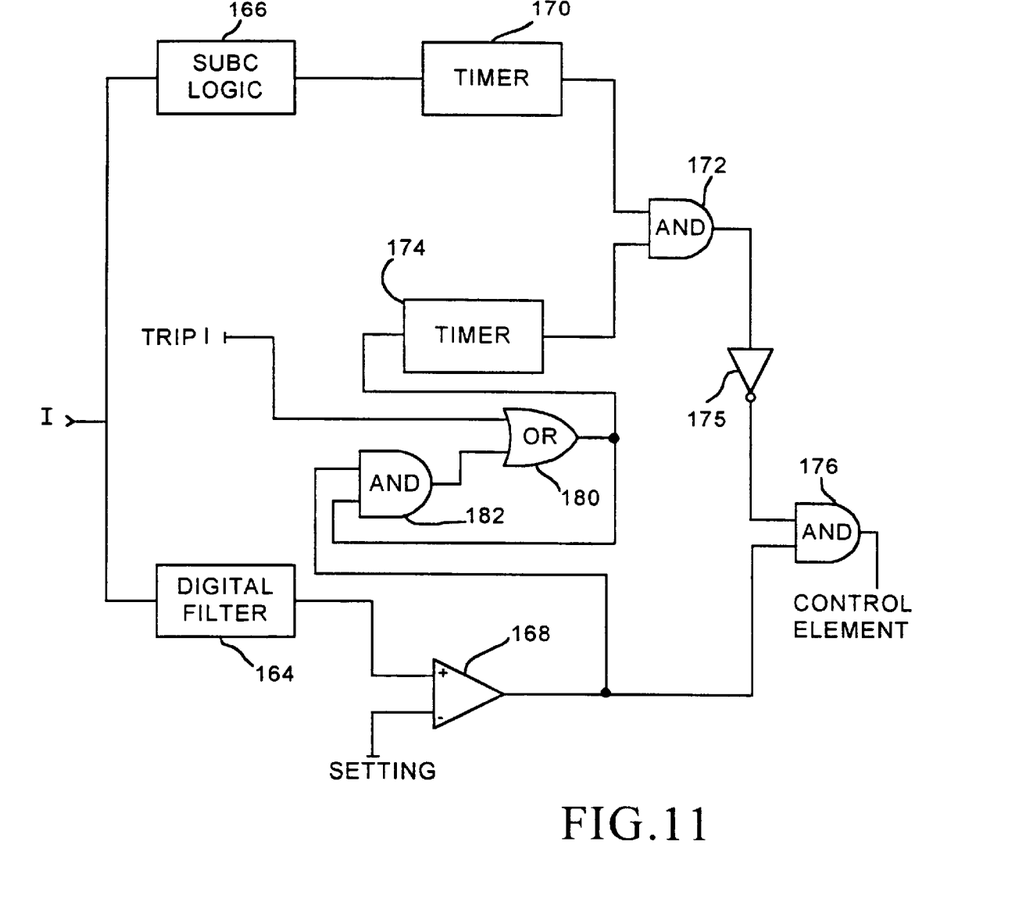
FIG. 11 is a variation of the embodiment of FIG. 10.
Figure 12:
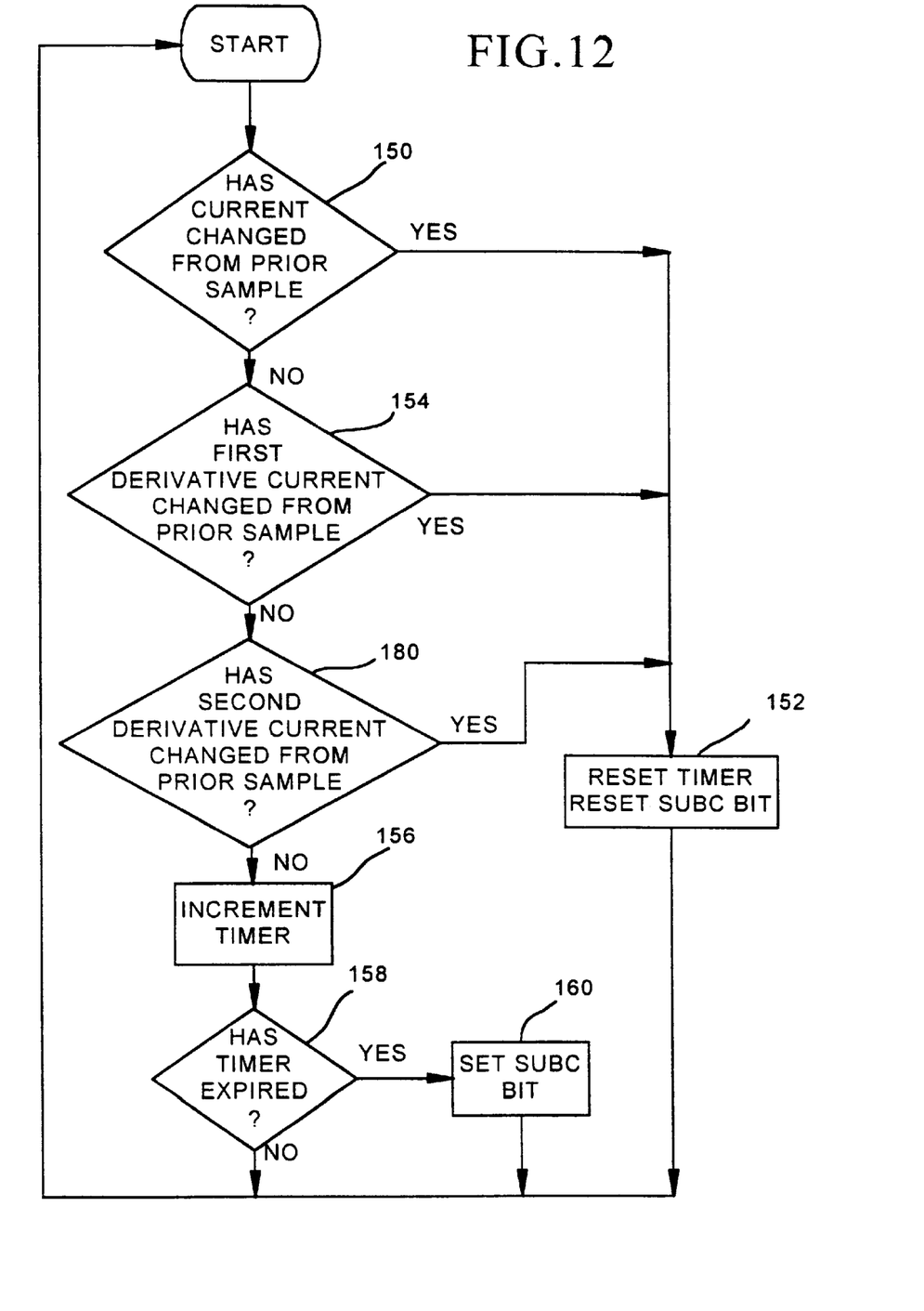
FIG. 12 is a variation of the block diagram of FIG. 9.

In the embodiment of FIGS. 1–8, the fastest time for determining subsidence current for a fully offset waveform was one cycle, which means that the circuit breaker could have opened, with subsidence current being present and hence delaying the indication of the opening of the breaker, for at least a full cycle before the control element indicating subsidence operates. In the embodiment of FIGS. 9–11, however, the operation time for the subsidence current control element is one-half cycle for a fully offset waveform, thus providing a 50 percent decrease in time necessary to produce a subsidence control element current signal. The variation shown in FIG. 12 is even faster, as discussed in more detail below.

FIG. 9 shows the logic circuit for determining the presence of subsidence current in the embodiment of FIGS. 10–11, using the secondary current and the first derivative thereof. The output of FIG. 9, a subsidence bit (SUBC), is applied to the circuit of FIG. 10 (and 11) to produce the output signal to the control element. Unfiltered current (raw I) is applied to the input of the circuit of FIG. 9. Each successive sample of raw current is compared to a previous sample, i.e. a sample at a selected previous time, which is settable by the operator. This could be the immediate past sample. This is shown at block 150 in FIG. 9. If a sign change has occurred between those two samples, a timer is reset, as shown at block 152.

The first derivative of the unfiltered current sample is then compared to a previous first derivative sample. If a sign change has occurred between those two derivative samples, as shown at 154, the timer at block 152 is reset. If a sign change is not detected by either step 150 or 154, the timer is incremented in step 156. If that timer times out before being reset, meaning that a selected number of cycles of the power system signal has gone by, in a specific time, the SUBC control element is set, shown at step 160. In the present embodiment the timer is set at one-half cycle.

The circuit of FIG. 9 is used in FIG. 10. In FIG. 10, (unfiltered raw) secondary current is applied to a digital filter 164 and the subsidence logic circuit 166 of FIG. 9. In digital filter 164, the input current is filtered and the magnitude of the current is calculated. The output of filter 164 is applied to the plus input of a comparator 168. Applied to the negative input of comparator 168 is the setting of the instantaneous overcurrent element in the protective relay, which is typically set extremely low, such that during steady-state (non-fault) operation, the signal at the plus input is larger than the setting at the negative input, such that the output of comparator 168 is high.

During steady-state operation, in which there is no subsidence current, the output of the subsidence logic circuit 166 will be low. This output is applied to a timer 170 which is a user-settable, delayed pickup, delayed dropout timer. In this particular application, the timer 170 has a delayed pickup of zero and a delayed dropout of one cycle. Timer 170 ensures that once subsidence current is detected and the output of the logic circuit 166 goes high, that the output of timer 170 will stay high for a minimum of one cycle after subsidence current is no longer recognized. The output of timer 170 is applied as one input to an AND gate 172.

When a fault occurs, the trip signal (such as generated by an overcurrent element in a protective relay) is applied as an input to a timer 174. Timer 174 is a delayed pickup, delayed dropout timer settable by the user. In the present application, the pickup delay is four cycles, while the dropout delay is zero cycles. The pickup delay prevents the output of timer 174 from asserting (going high) for four cycles after the trip signal goes high. This allows sufficient time for the circuit breaker to operate and provides security against an inadvertent false trip. The output of timer 174 is applied as another input to AND gate 172. Under normal (steady state) conditions, the output of timers 170 and 174 are both low, so that the output of AND gate 172 is also low.

The output of AND gate 172 is applied to an inverter 175. A low inverter input will result in a high output thereof. The output of inverter 175 is connected as one input to AND gate 176. The other input to AND gate 176 is from comparator 168. Under normal conditions, the output of comparator 168 will be high, as discussed above, as will the output from inverter 175. Hence, under normal, steady state conditions, the output of AND gate 176 will be high, indicating that AC current is indeed flowing through the circuit breaker and that it is closed.

When a fault occurs, the trip signal will go high, causing timer 174 to begin timing. As a result of the trip signal, the protective circuit breaker opens. There will no longer be AC current flowing, but subsidence current will be present. The input I to FIG. 10 will thus be basically subsidence current, i.e. a decaying exponential current waveform, as opposed to the normal AC waveform. The waveform from digital filter 164 will continue to exceed the setting at the negative input of comparator 168, such that the output of comparator 168 remains high.

The output of the subsidence logic 166 will now go high so that the input to timer 170 is high. This occurs one-half cycle after the subsidence current begins to flow, since the subsidence circuit of FIG. 9 makes a determination within one half cycle. The high output from timer 174 (4 cycles after the trip signal) will be applied to AND gate 172, along with the high output from timer 170. The output of AND gate 172 will thus go high and the output of the follow-on inverter 175 will be low. This will in turn cause the output of AND gate 176 to go low. This output from AND gate 176 is applied to a control element which is set by the low signal to indicate that the circuit breaker has opened.

FIG. 11 shows a modification of the circuit of FIG. 10. This circuit is for use when the trip signal (TRIP) is only present for a very short period of time and not present during the entire subsidence current determination, which is required by the circuit of FIG. 10. In FIG. 11, the trip signal (TRIP) is applied to an OR gate 180, the output of which is applied to timer 174. This is essentially identical, from an electrical standpoint, to the circuit of FIG. 10. However, the output of OR gate 180 is also applied as one input to an AND gate 182. The other input to AND gate 182 is the output of comparator 168. The feedback of the output of OR gate 180 as one input to AND gate 182 produces a latching effect for OR gate 180, so that once a trip signal occurs, the output of OR gate 180 to timer 174 will remain high, even though the trip signal may subsequently drop out, until the output of comparator 168 goes low.

Again, as with the circuit of FIG. 10, the presence of the subsidence current, i.e. a decaying exponential waveform, will result in the outputs of logic circuit 166, timer 170 and AND gate 172 all going high (following the TRIP signal) and the output of inverter 175 going low. The output of AND gate 176 thus will be low as well, which sets a control element indicating that the circuit breaker has in fact opened.

Eventually, the subsidence current will decay below the threshold of the setting at the negative input to comparator 168, which results in the output of that comparator going low, which resets the circuit for latching of the TRIP signal.

FIG. 12 shows a modification of the circuit of FIG. 9. FIG. 12 uses the current change between a current sample and a prior sample as well as the first derivative current change, as does FIG. 9, but also uses a second derivative current comparison. The second derivative of the unfiltered current waveform is compared to a previous second derivative sample in step 180, the time of the previous sample being settable by the operator. The previous sample could be the immediate past sample. If a sign change occurs in any of the comparisons, then the timer 152 is reset. If a sign change is not detected by any of the detectors, than the timer is incremented at step 156. If the timer expires before being reset, then the SUBC bit asserts. In this version, the fastest determination time for subsidence current with a fully offset waveform is one-quarter cycle, which is the maximum time between a zero crossing sign change, a first derivative sign change and a second derivative sign change.

Hence, the present invention produces a signal which indicates that the breaker contacts have opened in response to a fault condition on the power system. Such a signal indication is in advance of the indication which would otherwise be provided by the status of the overcurrent element, since overcurrent elements will remain picked up for some time following opening of the breaker, due to the existence of subsidence current.

Although a preferred embodiment of the invention has been disclosed herein for illustration, it should be understood that various changes, modifications and substitutions may be incorporated in such embodiment without departing from the spirit of the invention, which is defined by the claims as follows:

What is claimed is:

1. An apparatus for detection of subsidence current in a current transformer which is part of a power system which includes a protective relay and an associated circuit breaker, wherein the dropping-out of a current-responsive element in the protective relay indicates that the circuit breaker is open and wherein subsidence current applied to the current-responsive element prevents the current-responsive element from dropping out for an amount of time following opening of the breaker, the apparatus comprising:

means for detecting a zero crossing during a predetermined period of time for at least one of (a) unfiltered secondary current from the power system and (b) filtered secondary current from the power system, wherein the predetermined time is greater than half the period of the frequency of the power system signal and the lack of zero crossings indicates the presence of subsidence current; and     means for processing the output of the detector and the output status of the current-responsive element to generate a resulting signal which indicates that the breaker has in fact opened, in the event that no zero crossings are detected during said predetermined time.

2. An apparatus of claim 1, wherein the current-responsive element is an overcurrent element and wherein the overcurrent element has a current threshold which is set lower than normal load current.

3. An apparatus of claim 1, including means for detecting zero crossings for both unfiltered secondary current values and filtered secondary current values.

4. An apparatus of claim 3, wherein the processing means processes indications of subsidence current from the detectors in such a manner that the resulting signal is produced when one of the filtered and unfiltered current detectors has indicated the presence of subsidence current.

5. An apparatus of claim 4, wherein the processing means includes first and second timers and first and second AND gates, the first and second timers being responsive, respectively, to the outputs of the detectors, the first and second AND gates being responsive to inverted output signals from the timers and the output of the overcurrent element, the processing means further including a third AND gate responsive to outputs of the first and second AND gates.

6. An apparatus of claim 5, including an OR gate responsive to the output of the third AND gate and a fourth AND gate which is responsive to inverted outputs of the first and third AND gates and to an output of the second AND gate, and wherein the outputs of the fourth AND gate and the third AND gate are applied to said OR gate, the output of the OR gate providing the resulting signal.

7. An apparatus of claim 6, wherein the first and second timers are instantaneous pickup, delayed drop-out timers and wherein the circuit further includes a third timer connected between the third AND gate and the fourth AND gate, the third timer also being an instantaneous pickup, delayed drop-out timer.

8. An apparatus of claim 7, wherein the delayed drop-out time of the first timer is less than the delayed drop-out time of the second timer.

9. An apparatus of claim 7, wherein the delayed drop-out times for the first, second and third timers are settable by an operator.

10. An apparatus of claim 9, wherein the delayed drop-out time for the first timer is 1.125 cycles, for the second timer is 2.25 cycles and for the third timer is 2 cycles.

11. An apparatus of claim 2, including means for detecting saturation of circuit elements responsive to power system current which in turn feed the overcurrent element, thereby preventing an erroneous indication of circuit breaker opening when a large fault exists.

12. An apparatus of claim 2, including two overcurrent elements and means for using the two overcurrent elements to create a hysteresis effect in the determination of the presence of subsidence current.

13. A process for detection of subsidence current in a current transformer which is part of a power system which includes a protective relay and an associated circuit breaker, wherein the dropping out of a current-responsive element in the protective relay indicates that the circuit breaker is open and wherein existence of subsidence current applied to the current-responsive element prevents the current-responsive element from dropping out for a time following opening of the breaker, the process comprising the steps of:

detecting a zero crossing during a predetermined period of time for at least one of (a) unfiltered secondary current from the power system and (b) filtered secondary current from the power system, wherein the predetermined time is greater than half the period of the frequency of the power system signal and the lack of zero crossings indicates the presence of subsidence current; and     processing the output of the detector and the output status of the current-responsive element to generate a resulting signal which indicates that the breaker has in fact opened, in the event that no zero crossings are detected during said predetermined time.

14. A process of claim 13, wherein the current-responsive element is an overcurrent element and wherein the overcurrent element has a current threshold which is set lower than normal load current.

15. A process of claim 13, including the step of detecting zero crossings for both unfiltered secondary current values and filtered secondary current values.

16. A process of claim 13, wherein the step of processing includes processing indications of subsidence current from the detectors in such a manner that the resulting signal is produced when one of the filtered and unfiltered current detectors has indicated the presence of subsidence current.

17. A process of claim 13, including the step of detecting saturation of current elements in response to large values of line current, wherein the circuit elements in turn feed the overcurrent element, thereby preventing an erroneous indication of the circuit breaker opening when a large fault exists.

18. A process of claim 13, including the step of using two overcurrent elements to create a hysteresis effect in the determination of the presence of subsidence current.

19. An apparatus for detection of subsidence current in a current transformer which is part of a power system which includes a protective relay and an associated circuit breaker, wherein the dropping-out of a current-responsive element in the protective relay indicates that the circuit breaker is open and wherein subsidence current applied to the current-responsive element prevents the current-responsive element from dropping out for an amount of time following actual opening of the breaker, the apparatus comprising:

means for detecting whether a zero crossing has occurred in the time interval between a present sample and a prior sample of unfiltered secondary current from the power system;

means for detecting whether a sign change has occurred for a first derivative of said present sample and said prior sample during said time interval;

means for determining whether a zero crossing or a sign change has been detected during a preestablished time; and     means responsive to said determining means for generating an output signal which is indicative of the presence of subsidence current, if no zero crossings or sign changes have occurred during said preestablished time, wherein the output signal is useful in indicating that the circuit breaker has opened.

20. An apparatus of claim 19, wherein the preestablished time is approximately one-half cycle.

21. An apparatus of claim 19, wherein the prior sample is the immediate past sample.

22. An apparatus of claim 19, including means responsive to said output signal for generating a control signal indicating that the circuit breaker has opened after a trip signal from the protective relay is detected.

23. An apparatus of claim 22, including means for delaying the trip signal in the apparatus for a first selected number of cycles following initiation thereof by the protective relay.

24. An apparatus of claim 23, including means for maintaining the output signal indicating the presence of subsidence current for a second selected number of cycles following initial recognition thereof.

25. An apparatus of claim 24, wherein the first selected number of cycles is four and the second selected number of cycles is one.

26. An apparatus of claim 22, including means for filtering the unfiltered current and means for comparing the magnitude of the filtered current with a preestablished setting, and wherein the generating means includes means producing the output signal only when the filtered current exceeds the preestablished setting.

27. An apparatus of claim 19, including means for detecting whether a sign change has occurred for a second derivative of said present current sample and said prior sample and wherein the output signal indicating the presence of subsidence current is only generated if no sign change has occurred during said preestablished time in the present current and the first and second derivatives thereof.

28. A process for detection of subsidence current in a current transformer which is part of a power system which includes a protective relay and an associated circuit breaker, wherein the dropping-out of a current-responsive element in the protective relay indicates that the circuit breaker is open and wherein subsidence current applied to the current-responsive element prevents the current-responsive element from dropping out for an amount of time following actual opening of the breaker, the apparatus comprising the steps of:

detecting whether a zero crossing has occurred in the time interval between a present sample and a prior sample of unfiltered secondary current from the power system;

detecting whether a sign change has occurred for a first derivative of said present sample and said prior sample during said time interval;

determining whether a zero crossing or a sign change has been detected during a preestablished time; and generating an output signal which is indicative of the presence of subsidence current if no zero crossings or sign changes have occurred during said preestablished time, wherein the output signal is useful in indicating that the circuit breaker has opened.

29. A process of claim 28, wherein the preestablished time is approximately one-half cycle.

30. A process of claim 28 wherein the prior sample is the immediate past sample.

31. A process of claim 30, including the step of producing a control signal indicating that the circuit breaker has opened after a trip signal from the protective relay is detected.

32. A process of claim 31, including the step of delaying the trip signal for a first selected number of cycles following initiation thereof by the protective relay.

33. A process of claim 32, including the step of maintaining the output signal indicating the presence of subsidence current for a second selected number of cycles following initial recognition thereof.

34. A process of claim 33, wherein the first selected number of cycles is four and the second selected number of cycles is one.

35. A process of claim 31, including the step of filtering the unfiltered current and comparing the magnitude of the filtered current with a preestablished setting, and wherein the generating means includes means producing the output signal only when the filtered current exceeds the preestablished setting.

36. A process of claim 28, including the step of detecting whether a sign change has occurred for a second derivative of said present current sample and said prior sample and wherein the output signal indicating the presence of subsidence current is only generated if no sign change has occurred during said preestablished time in the present current and the first and second derivatives thereof.

* * * * *